United States Patent [19]

Märk

[11] 4,155,011
[45] May 15, 1979

[54] APPARATUS FOR TREATING SUBSTRATES WITH AN ION BEAM

[75] Inventor: Martin Märk, Feldkirch, Austria

[73] Assignee: Balzers Aktiengesellschaft fur Hochvakuumtechnik und Dunne Schichten, Liechtenstein

[21] Appl. No.: 862,683

[22] Filed: Dec. 21, 1977

[30] Foreign Application Priority Data

Dec. 27, 1976 [CH] Switzerland .................. 16342/76

[51] Int. Cl.² ............................................. H01J 37/00
[52] U.S. Cl. .................. 250/492 A; 250/398; 250/443
[58] Field of Search ............... 250/492 A, 492 R, 398, 250/396, 444, 443, 439; 313/46, 11; 219/121 EB

[56] References Cited

U.S. PATENT DOCUMENTS

| | | | |
|---|---|---|---|
| 3,168,646 | 2/1965 | Busch et al. | 250/443 |
| 3,689,766 | 9/1972 | Freeman | 250/492 A |
| 3,778,626 | 12/1973 | Robertson | 250/492 X |
| 3,920,233 | 11/1975 | Stuckert | 250/492 A |
| 3,930,163 | 12/1975 | Gerlach et al. | 250/398 |

*Primary Examiner*—Bruce C. Anderson
*Attorney, Agent, or Firm*—McGlew and Tuttle

[57] ABSTRACT

An apparatus for treating a substrate with an ion beam comprising a closed housing which defines a substantially evacuatable chamber, a drum having a circumferential portion with an annular inside surface rotatably mounted in the chamber, drive means connected to the drum for rotating it at a selected speed to establish a centrifugal force toward the annular inside surface of the drum and ion beam generating means associated with the housing for directing an ion beam into the chamber and toward the annular inside surface. A substrate is supportable on the inside surface of the drum and conforms with the surface so as to be closely associated therewith under the influence of the centrifugal force. This association establishes a thermally conductive relationship between the substrate and the circumferential portion so that heat generated in the substrate due to the ion beam can be dissipated through the circumferential portion of the drum.

9 Claims, 2 Drawing Figures

APPARATUS FOR TREATING SUBSTRATES WITH AN ION BEAM

FIELD AND BACKGROUND OF THE INVENTION

The present invention relates in general to an apparatus for treating substrates with an ion beam, and in particular to a new and useful ion implantation device which provides for an efficient thermal conduction away from the substrates to prevent the overheating thereof.

DESCRIPTION OF THE PRIOR ART

Well known ion implantation apparatus serve the purpose of embedding ions into the surface of substrates to a selected depth. Such implantation is used to impart certain physical properties to these substrates. The implantation is effected by bombarding the surfaces to be treated in a vacuum with an ion beam which is produced by means of an ion gun. The objective is to distribute the ions over the surface in a desired and definite manner. Frequently, a distribution over the entire surface is sought which is uniform within the range of ±1%.

The state of the art in the field of the invention has been comprehensively described by:

(1) G. Ryding in "Ion Implantation: Higher Beam Currents for Higher Throughput", Electronic Packaging and Production, March 1975, pages 67 through 74, and (2) A. Wittkower in "Wafer Handling for Ion Implantation", Electronic Packaging and Production, May 1973, pages 95 through 104.

The state of the art as expressed in these references is assumed as known in this specification.

Accordingly, ion implantation apparatus are known comprising a working chamber in which a drum, as carrier of the substrates to be treated, is mounted for rotation and associated with a device for producing a beam of the ions to be implanted; (see particularly FIGS. 4 and 6 on page 95 of reference 2).

A frequently occurring disadvantage of devices of the prior art is that due to the bombardment with the ion beam, the substrates are excessively heated, which causes undesirable effects. That is, in a vacuum, it is difficult to obtain effective heat dissipation by heat conduction, in that a constant, satisfactory contact between the substrates and the support is a problem to establish. It is known from experience that beam intensities in excess of about 1 $\mu$A per cm$^2$ easily result in substrate temperatures exceeding 100° C. Since the development of ion techniques favors high ion currents in order to increase the output rate, the greatest attention must be paid to the heating effect of the beam.

It is known to keep the substrates at a low temperature by cementing them on the heat eliminating substrate carrier. This, however, is complicated and can hardly be done in apparatus with an automatic feed. Another way of keeping the temperature low is to distribute the beam energy over a greater number of substrates by treating them simultaneously. This method, however, extends the time necessary for treating a single charge of substrate.

SUMMARY OF THE INVENTION

The present invention is directed to an ion implantation device for solving the problem of heat dissipation without requiring complicated additional measures for establishing a satisfactory thermal contact between the substrate carrier and the substrate.

In accordance with the invention, there is provided an apparatus for treating substrates with an ion beam, comprising a working chamber accommodating a rotatable drum as the carrier of the substrates to be treated. The drum is mounted in the chamber and associated with a device for producing an ion beam, in which the inside surface of the circumferential wall of the drum is designed as a supporting surface for the substrates and the beam is directed toward this surface to impregnate the substrates thereon with ions.

By placing the substrates on the inside of a drum which is rotating during operation, the substrates are automatically pressed against the inside surface due to the centrifugal force, whereby a substantially improved thermal contact is established, necessitating no particular measures such as cementing or the like. Due to the better heat dissipation, a smaller number of substrates is able to sufficiently distribute the energy of the beam and therefor it is possible to manufacture apparatus for small charges when desired.

Another advantage of the invention as compared to prior art implantation apparatus, where the substrates are supported on the outside of a rotary drum is that the overall length of the apparatus is reduced, namely by the diameter of the drum. Further, with the inventive design, it becomes easy to provide a device for monitoring the cross section of the beam near the impact area of the ion beam, which permits a substantially better supervision of the operation.

It is therefore an object of the invention to provide an apparatus for treating a substrate with an ion beam comprising, a closed housing defining a substantially evacuatable chamber, a drum having a circumferential portion with an annular inside surface rotatably mounted in the chamber, drive means connected to the drum for rotating it at a selected speed to establish a centrifugal force toward the annular inside surface of the drum, and an ion beam generating means associated with the housing for directing an ion beam into the chamber and at the annular inside surface of the drum.

Another object of the invention is to provide an apparatus wherein the substrate is positionable on the annular inside surface of the drum and is of a shape conformant with the shape of the annular inside surface of the drum so that a close thermally conductive association can be established between the substrate and the annular inside surface to permit the dissipation of heat from the substrate to the drum.

A still further object of the invention is to provide an apparatus wherein the circumferential portion of the drum is of a shape conforming to the different shapes of the substrate to permit the close thermally conductive engagement.

A still further object of the invention is to provide the drum with a circumferential portion that is in the form of a truncated cone so that the beam entering the chamber will strike the substrate supported on the circumferential portion perpendicularly to the surface of the substrate.

A further object of the invention is to provide an apparatus for treating a substrate with an ion beam which is simple in design, rugged in construction and economical to manufacture.

The various features of novelty which characterize the invention are pointed out with particularity in the claims annexed to and forming a part of this disclosure. For a better understanding of the invention, its operating advantages and specific objectives obtained by its uses reference should be made to the accompanying drawings and descriptive matter in which there is illustrated a preferred embodiment of the invention.

DESCRIPTION OF THE PREFERRED EMBODIMENTS

Figure 1:
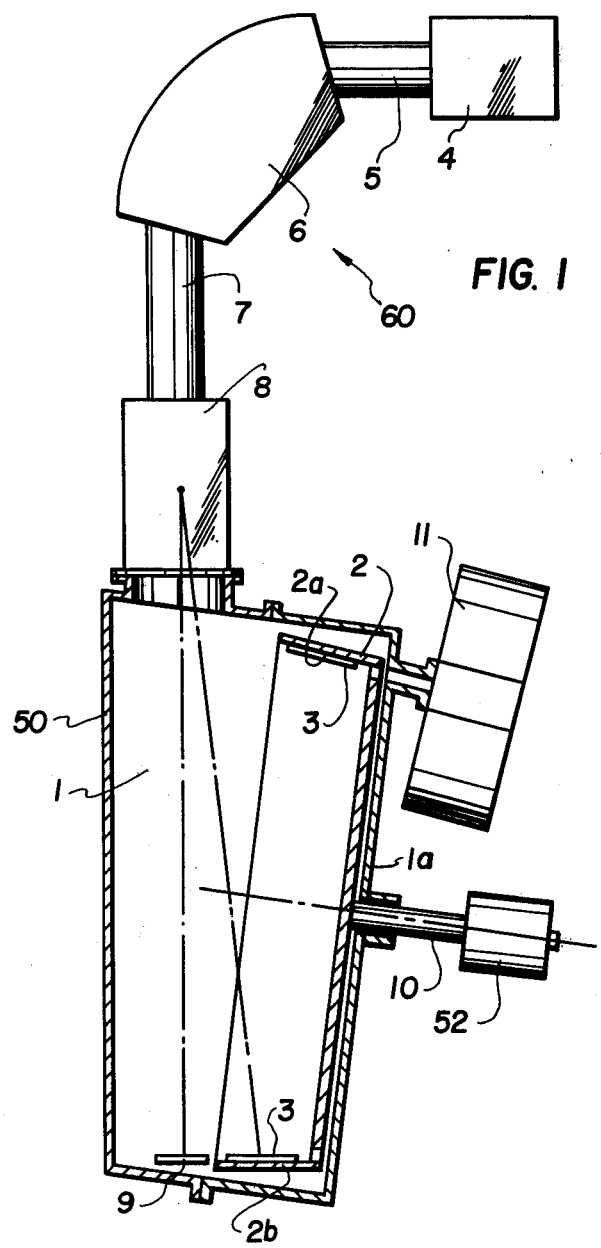
FIG. 1 is a side elevational view of an embodiment comprising a working chamber in which a rotary drum is mounted as the substrate carrier.

Referring now to the drawings in particular, FIG. 1 is a diagrammatical illustration of an apparatus comprising a housing 50 defining an evacuatable chamber 1 and a rotary drum 2 which is mounted within the chamber. Drum 2 includes a circumferential portion 2b with an inside annular surface 2a on which substrates 3 are secured. For securing the substrates, simple retaining mechanisms are sufficient which do not damage the surface and require no particular precision in manufacture. In spite of that, a satisfactory thermal contact during operation is obtained by the fact that due to the centrifugal force, the substrate plates 3 are firmly pressed against the inside of the carrier drum. Consequently, to ensure a reliable thermal contact, it is sufficient to make the two contacting surfaces, namely the respective inside annular surface of the drum and the facing surface of the substrate, geometrically conformable with each other.

Working chamber 1 is connected to an ion beam generating means for producing the ion beam generally designated 60. This device may comprise, for example, an ion source 4, a preliminary accelerating section 5 for the ion beam, a following separating magnet 6, a subsequent accelerating section 7 for the ions, and a deflector 8 for the ion beam. The purpose of separating magnet 6 is to separate neutral particles from the beam and to sort out, in the manner of a mass spectrometer, only ions having a predetermined mass which are useful for the respective process of implantation. The separated ions are then accelerated to the necessary energy level in section 7 and, controlled by deflector 8 to impinge upon the substrates. The deflector 8 also makes it possible to direct the beam selectively against a monitoring device 9, for example a fluorescent screen, for continuously monitoring the cross section of the beam, so that during the operation, the beam may be continuously checked and adjusted to an optimum, without having to interrupt production.

FIG. 1 further shows diagrammatically the drive shaft 10 for the drum 2 which passes through the back wall 1a of the working chamber and which is driven from the outside. Shaft 10 is hermetically sealed with wall 1a. A charging and discharging air lock 11 is provided for permitting the introduction or removal of substrates into or from the working chamber without having to interrupt the vacuum. Shaft 10 can be rotated by motor 52 to establish the centrifugal force needed in this invention.

Figure 2:
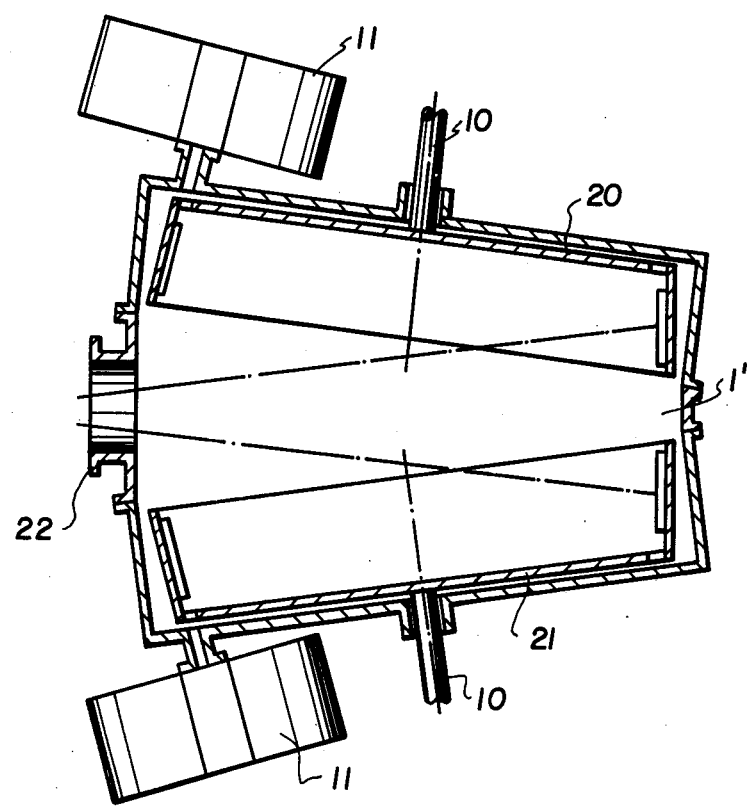
FIG. 2 is a view similar to FIG. 1 of another embodiment of the invention comprising two rotary drums in the same working chamber.

FIG. 2 shows an analogous embodiment in which two rotary drums 20 and 21 are provided as substrate carriers in the working chamber 1'. In this way, an apparatus having a double capacity is obtained. The working chamber 1' of FIG. 2 is connected, by means of a flange 22, to a device for producing an ion beam, for example, to the same device 60 as shown in FIG. 1. Then, during operation and by means of deflector 8 (FIG. 1), it is possible in the apparatus of FIG. 2 to direct the ion beam selectively against the substrates retained on the one or the other drum. The implantation may thus be carried out alternately on substrates of one of the drums, while the other drum is charged with new substrates.

It will be understood by one skilled in the art that the apparatus described in connection with an ion implantation process may be used in a similar manner for other processes in which the surface of substrates is to be bombarded with an ion beam. For example, such an apparatus may be used for removing surface layers from substrates by ion bombardment, or, under different operational conditions, to effect a vapor deposition supported by ions.

It is further possible to form the inside surface of the rotary drum, upon which the substrates are to be placed with a geometrical shape conforming to particular requirements of the shape of the substrates. For example, the inside surface may be provided with recesses into which lenses are inserted which are to be coated in an ion coating process. It is desirable to have the beam strike the substrate when the substrate is perpendicular to the beam or nearly so. To accomplish this the circumferential portion 2b of the drum is preferably formed as a truncated cone as shown in the Figures. For flat plate-shaped substrates, it may be advantageous to provide the circumferential wall of the drum in the shape of a polygonal prism, so that every prism face may receive one plate to be coated and thus provide a close association between drum and substrate. As mentioned, care must be taken to provide a shape such as to have a satisfactory superficial contact between the substrate and the drum, so that due to the pressure exerted by the centrifugal force, the necessary heat dissipation can take place.

As shown in the drawing, the angle between the axis of the drum and the direction of the ion beam is different from 90°. Advantageously, the inside of the drum is designed as a conical surface of such angle that the ion beam impinges on the substrates perpendicularly to its surface and that no deflecting device is needed in the area of the drum axis for adjusting the direction of the ion beam. This design is illustrated in FIGS. 1 and 2.

While specific embodiments of the invention have been shown and described in detail to illustrate the application of the principles of the invention, it will be understood that the invention may be embodied otherwise without departing from such principles.

What is claimed is:

1. An apparatus for treating a substrate with an ion beam comprising, a closed housing defining a substantially evacuatable chamber, a drum having a circumferential portion with an annular inside surface rotatably mounted in said chamber, drive means connected to said drum for rotating it at a selected speed to establish a centrifugal force toward said annular inside surface, ion beam generating means associated with said housing for directing an ion beam into said chamber and at said annular inside surface of said drum, the substrate to be treated being positionable on said annular inside surface and conformable thereto to form a thermally conductive engagement with said circumferential portion under the influence of the centrifugal force established in said drum and to allow the substrate to pass in front of the ion beam, heat being generated on the substrate due to the ion beam being dissipated through said thermally conductive engagement.

2. An apparatus according to claim 1, further including an ion beam detector positioned in said housing adjacent said circumferential portion of said drum, said ion beam generating means further including a deflector for deflecting the ion beam from said detector to said circumferential portion.

3. An apparatus according to claim 1, wherein said circumferential portion of said drum is in the shape of a truncated cone and the ion beam enters said chamber at an angle other than 90° to the axis of rotation of said drum so that the ion beam strikes the substrate positioned on said inside surface of said circumferential portion in a direction perpendicular to the surface of the substrate.

4. An apparatus according to claim 1, wherein said circumferential portion is in the form of a polygonal prism, the substrate being a size to fit on one of the sides of said polygonal prism and having a substrate conformable to the side of said polygonal prism.

5. An apparatus according to claim 1, wherein said circumferential portion having the annular inside surface is conformant to the shape of a substrate to be positioned thereon.

6. An apparatus for treating substrates by imbedding ions into the surface thereof, comprising a housing defining an evacuatable working chamber, a drum, rotatably mounted in said chamber and having an interior circumferential surface on which the substrates to be treated are placed, a device for producing an ion beam mounted on said housing and directed into said chamber through the substrate on the interior circumference of said drum, said drum being rotatable to impart a centrifugal force to the substrate to press it against the interior circumferential surface due to centrifugal force to thereby establish an improved thermal contact and to position the substrate during the treatment thereof.

7. An apparatus for treating substrates by imbedding ions into the surface thereof, comprising a housing defining an evacuatable working chamber, a drum rotatably mounted in said chamber and having an interior circumferential surface on which the substrates to be treated are placed, a device for producing an ion beam mounted on said housing and directed into said chamber through the substrate on the interior circumference of said drum, said drum being rotatable to impart a centrifugal force to the substrate to press it against the interior circumferential surface due to centrifugal force to thereby establish an improved thermal contact and to position the substrate during the treatment thereof, the axis of said drum forming with the direction of the ion beam an angle differing from 90°.

8. An apparatus for treating substrates by imbedding ions into the surface thereof, comprising a housing defining an evacuatable working chamber, a drum rotatably mounted in said chamber and having an interior circumferential surface on which the substrates to be treated are placed, a device for producing an ion beam mounted on said housing and directed into said chamber through the substrate on the interior circumference of said drum, said drum being rotatable to impart a centrifugal force to the substrate to press it against the interior circumferential surface due to centrifugal force to thereby establish an improved thermal contact and to position the substrate during the treatment thereof, the inside surface of the drum being a conical surface having a cone angle such that the direction of the beam is perpendicular to the inside surface.

9. An apparatus for treating substrates by imbedding ions into the surface thereof, comprising a housing defining an evacuatable working chamber, a drum rotatably mounted in said chamber and having an interior circumferential surface on which the substrates to be treated are placed, a device for producing an ion beam mounted on said housing and directed into said chamber through the substrate on the interior circumference of said drum, said drum being rotatable to impart a centrifugal force to the substrate to press it against the interior circumferential surface due to centrifugal force to thereby establish an improved thermal contact and to position the substrate during the treatment thereof, said working chamber being equipped with two rotary drums and with a deflecting device for the ion beam, for selectively directing the ion beam against the substrates received in the two drums.

* * * * *